United States Patent
Mandelman et al.

[11] Patent Number: 6,097,070
[45] Date of Patent: Aug. 1, 2000

[54] MOSFET STRUCTURE AND PROCESS FOR LOW GATE INDUCED DRAIN LEAKAGE (GILD)

[75] Inventors: Jack A. Mandelman, Stormville; Carl J. Radens, La Grangeville, both of N.Y.

[73] Assignee: International Business Machines Corporation, Armonk, N.Y.

[21] Appl. No.: 09/250,881

[22] Filed: Feb. 16, 1999

[51] Int. Cl.[7] .............. A01L 29/76; A01L 29/94; A01L 31/113; A01L 31/119; A01L 31/062

[52] U.S. Cl. .......... 257/389; 257/387; 257/412; 257/344; 257/336; 257/333

[58] Field of Search ................ 257/389, 282, 257/340, 346, 406, 407, 369, 385, 387, 344, 336, 408, 412

[56] References Cited

U.S. PATENT DOCUMENTS

| | | |
|---|---|---|
| 3,855,610 | 12/1974 | Matsuda et al. ............ 357/23 |
| 5,061,647 | 10/1991 | Roth et al. . |
| 5,146,291 | 9/1992 | Watabe et al. . |
| 5,210,435 | 5/1993 | Roth et al. . |
| 5,314,834 | 5/1994 | Mazure et al. . |
| 5,371,391 | 12/1994 | Sato ............ 257/387 |
| 5,405,787 | 4/1995 | Kurimoto . |
| 5,426,327 | 6/1995 | Murai . |
| 5,460,998 | 10/1995 | Liu . |
| 5,498,556 | 3/1996 | Hong et al. . |
| 5,554,544 | 9/1996 | Hsu . |
| 5,619,057 | 4/1997 | Komatsu . |
| 5,621,236 | 4/1997 | Choi et al. ............ 257/389 |
| 5,654,212 | 8/1997 | Jang . |
| 5,684,317 | 11/1997 | Hwang . |
| 5,714,786 | 2/1998 | Gonzalez et al. ............ 257/344 |
| 5,892,249 | 4/1999 | Courtright et al. ............ 257/209 |
| 5,900,668 | 5/1999 | Wollesen ............ 257/522 |

*Primary Examiner*—Mahshid Saadat
*Assistant Examiner*—Jesse G. Fenty
*Attorney, Agent, or Firm*—McGinn & Gibb, P.C.; Daryl K. Neff, Esq.

[57] ABSTRACT

A structure and method for forming a metal oxide semiconductor field effect transistor structure comprises, a substrate having a gate-channel region and source and drain regions adjacent the gate-channel region, a gate insulator over the substrate, a central gate conductor positioned above the gate-channel region and over the gate insulator and outer gate conductors over the gate insulator and adjacent the central gate conductor, wherein the gate insulator has a first thickness under the central gate conductor and a second thickness greater than the first thickness under the outer gate conductors. The center and outer gate conductors may consist of different material types (i.e., different work functions). The polarity of the source-drain doping is independent of the polarity of the central or outer gate conductors.

17 Claims, 4 Drawing Sheets

MOSFET STRUCTURE AND PROCESS FOR LOW GATE INDUCED DRAIN LEAKAGE (GILD)

BACKGROUND OF THE INVENTION

1. Field of the Invention

The present invention generally relates to integrated circuits and more specifically to structures and methods for reducing gate induced drain leakage in semiconductor devices.

2. Description of the Related Art

As device geometries shrink, reliability problems due to gate induced drain leakage (GIDL) force the integrated circuit to operate at voltages which are lower than desired for best performance. Gate induced drain leakage results from the generation of electron-hole pairs in the surface the depletion region of a field effect transistor (FET) along the area where the gate conductor overlaps the drain diffusion region when the device is biased such that the drain potential is more positive (by greater than approximately 1V) than the gate potential.

As shown in FIG. 1 it is necessary for a portion of the drain diffusion region 10 to be positioned under the gate conductor 11. Therefore, if the gate conductor were at 0 V and the drain diffusion region 10 were at a positive voltage there would be a volume of carrier generation 12 due to the drain 10 to gate 11 electric field, which decreases device performance. In logic circuits, GIDL increases standby power. In a DRAM (dynamic randan access memory) array MOSFET (metal oxide semiconductor field effect transistor) GIDL degrades data retention time.

Furthermore, the GIDL problem is exacerbated when DRAM array MOSFETS are operated at negative wordline low levels or with an opposite gate doping polarity (i.e. P+ gated N-type field effect transistor (NFET)) because such operating parameters increase the potential between the drain and the gate conductor.

Therefore, there is a need to produce a structure which eliminates the gate induced drain leakage problem.

SUMMARY OF THE INVENTION

It is, therefore, an object of the present invention to provide a structure and method for forming a metal oxide semiconductor field effect transistor structure. The structure includes a substrate having a gate-channel region and source and drain regions adjacent the gate-channel region, a gate insulator over the substrate, a central gate conductor positioned above the gate-channel region and over the gate insulator and outer gate conductors over the gate insulator and adjacent the central gate conductor, wherein the gate insulator has a first thickness under the central gate conductor and a second thickness greater than the first thickness under the outer gate conductors.

The structure can also include a silicide layer above the central gate conductor and the outer gate conductors electrically connecting the central gate conductor and the outer gate conductors.

The gate insulator separates the central gate conductor from the outer gate conductors. The outer gate conductors are above a portion of the source and drain regions. The central gate conductor comprises a first material and the outer gate conductors comprise a second material different than the first material. The first material comprises a first type of polysilicon and the second material comprises a second type of polysilicon.

The inventive method includes forming a substrate to have a gate-channel region and diffusion regions adjacent the gate-channel region, forming an insulator layer over the substrate, forming a central conductor above the gate-channel region and over the insulator; and forming outer conductors over the insulator and adjacent the central conductor, wherein the insulator over the substrate is formed to have a first thickness under the central conductor and a second thickness greater than the first thickness under the outer conductors.

The inventive method also includes forming a conductive layer above the central conductor and the outer conductors to electrically connect the central conductor and the outer conductors.

The formed insulator separates the central conductor from the outer conductors. The forming of the outer conductors positions the outer conductors above a portion of the diffusion regions. The forming of the central conductor comprises forming a first material and the forming of the outer conductors comprises forming a second material different than the first material.

The forming of the insulator comprises, forming a central conductor insulator to have a first thickness, before forming the central conductor and forming outer conductor insulators to have a second thickness, after forming the central conductor.

Before forming the insulator, the method includes forming pad insulators above the substrate and forming sidewall spacers on the pad insulators; and, after the forming of the central conductor, removing the sidewall spacers to create gaps between the central conductor and the pad insulators, wherein the outer conductor insulators and the outer conductors are formed in the gaps.

Thus, the gate insulator thicknesses under the central gate conductor and under the outer conductors are independently specifiable. This allows the gate insulator under the outer conductors to be preferably thicker than under the central conductor which reduces gate induced drain leakage, which is valuable for low power applications, including low-power DRAM.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
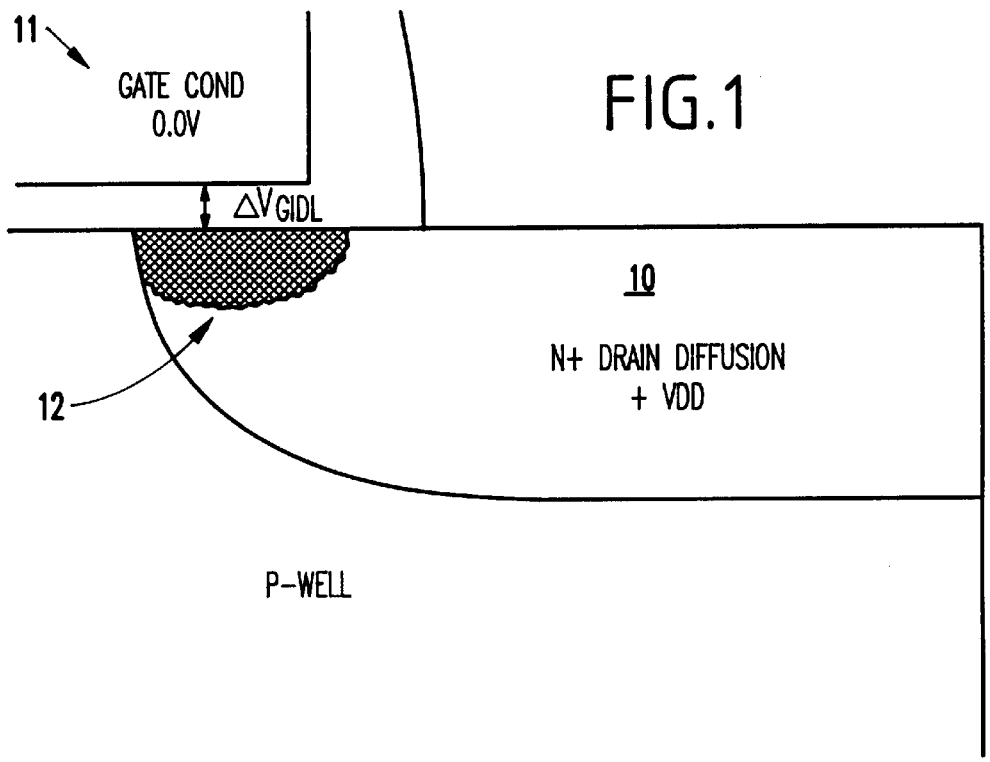
FIG. 1 is a schematic diagram of a transistor.
Figure 2:
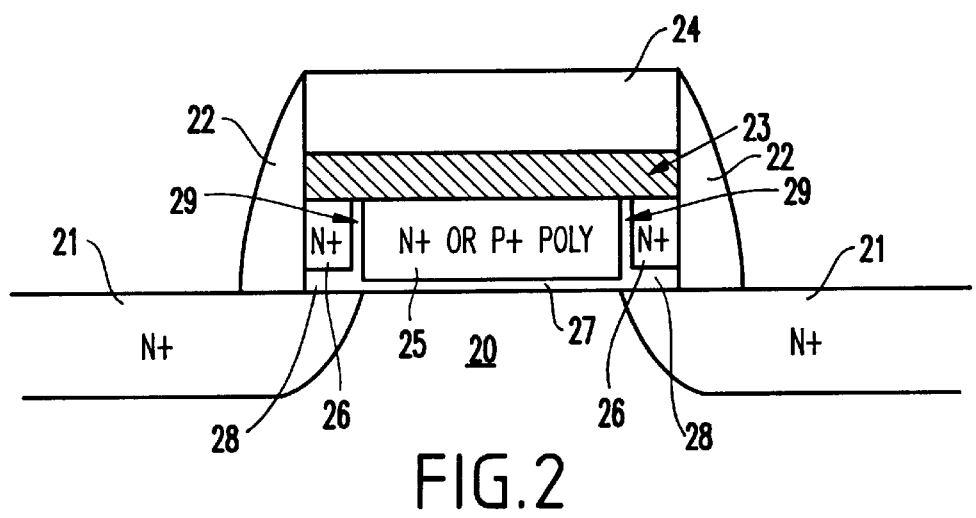
FIG. 2 is a schematic diagram of a cross-sectional view of an integrated circuit according to the invention.

Referring now to FIG. 2, a preferred embodiment of the invention is illustrated. More specifically, the inventive structure includes a gate-channel region 20, source and drain regions 21, a gate dielectric layer 27, 28, a central gate conductor 25, outer (e.g., edge) gate conductors 26, a conductive layer 23, a cap 24 and insulating spacers 22. The structure is formed using various processes, such as those discussed below with respect to FIGS. 3A–4C.

With the inventive outer gate conductors 26, the dielectric 27, 28 thickness can be increased in the area 28 where the source and drain 21 overlap the gate, which reduces gate induced drain leakage, and overlap capacitance. Further, the outer gate conductors 26 are somewhat insulated from the central gate conductor 25 by the gate dielectric 29, which further reduces the gate induced drain leakage problem discussed in the Background section. Thus, the inventive structure tailors the gate work function and/or the gate oxide thickness in the gate-to-drain overlap region 28.

For the case of an NMOSFET, by making the central gate conductor 25 of P+ doped polysilicon, lower channel doping concentrations can be used while maintaining a given threshold voltage. This is a result of the additional workfunction (e.g., 1.1V) of the different materials (e.g., the P+ polysilicon relative to N+ polysilicon). Due to these lower surface doping concentration requirements for the channel of the array MOSFET, the inventive structure provides reduced junction leakage and immunity to STI divot depth variations making it an attractive candidate for dynamic random access memory (DRAM) array metal oxide semiconductor field effect transistor (MOSFET) beyond 1 Gb.

For example, the invention reduces the GIDL stress voltage by 1.1V compared to similarly sized conventional P+ gated devices. As is well known, P+ gated NMOSFETs are useful for realizing practical threshold voltages at low surface doping concentrations. The invention is very useful for reducing junction leakage and sensitivity to STI divot variations for such DRAM array devices.

A key feature of the invention is that the thickness of the dielectric 28 under the edge gate conductors 26 may be tailored independently of the dielectric thickness 27 of the middle gated region 25 to provide reduced GIDL field and gate 25, 26 to diffusion overlap capacitance. The silicide layer 23 provides a low resistance strap between gate conductor regions 25, 26.

The dielectric thickness between the gate conductor regions 29 can be made sufficiently thin to prevent the formation of a surface potential barrier, should the interpoly oxide 29 overlap part of the channel 20. The thickness of insulator 29 is preferably no more than twice the thickness of insulator 28. The interpoly oxide 29 may be leaky without any deleterious electrical effects, since its main purpose is to serve as a diffusion barrier to dopant impurities. Thus, the integrity of the interpoly oxide 29 is not of serious concern. Further, even in the case of N+ edge gates 26, and a P+ middle gate 25 with the invention interdiffusion is avoided.

Figure 3A:
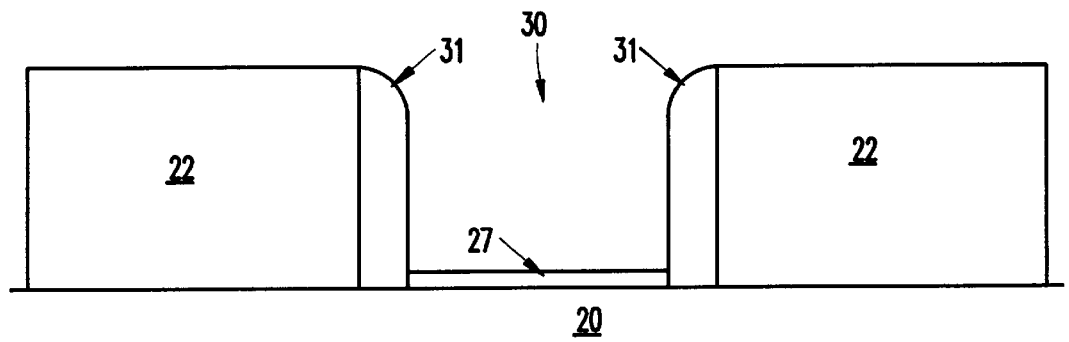
FIG. 3A–3C are schematic diagrams of a cross-sectional view of a partially completed integrated circuit according to the invention.
Figure 3B:
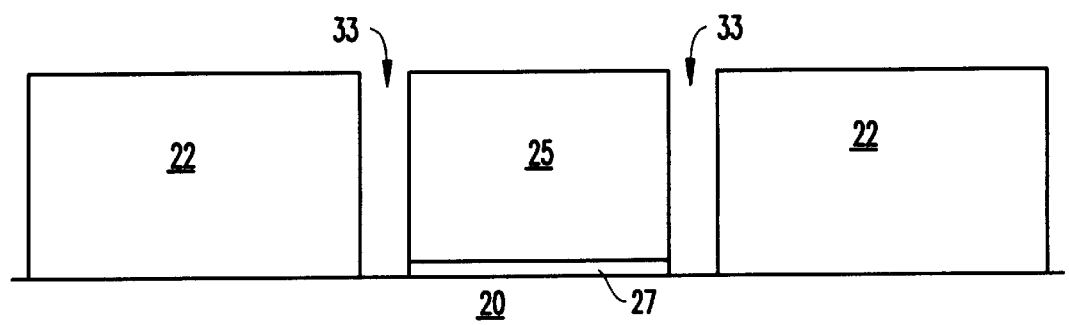
Figure 3C:
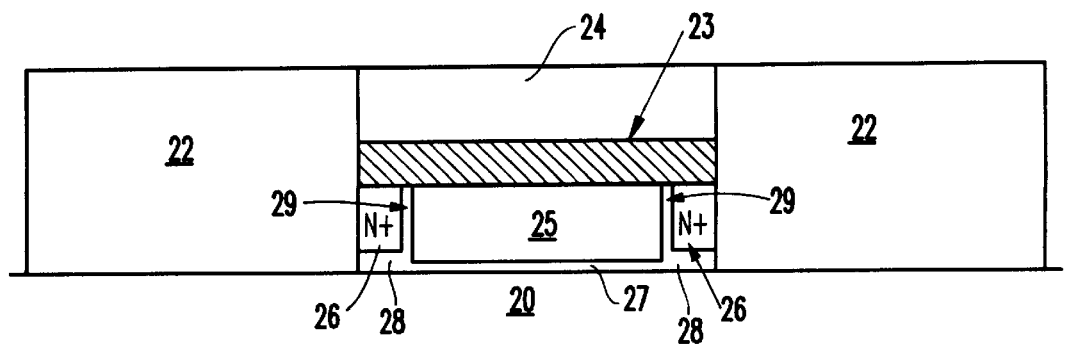

Referring now to FIGS. 3A–3C a first preferred method of manufacturing the above structure is shown. Initially, a thick pad dielectric 22, (the thick pad may have multiple layers), such as an oxide or nitride pad layer or combination is deposited, using conventional processes such as sputtering, chemical vapor deposition (CVD) or physical vapor deposition (PVD), on a substrate 20, such as a silicon substrate and an opening 30 is patterned in the thick pad dielectric 22 using conventional methods, such as lithography, masking and etching.

Sacrificial spacers 31 are formed on the sidewalls of the opening 30. For example, a conformal layer of material 31, such as a nitride, is deposited over the structure and a selective etch process, such as reactive ion etching (RIE) is applied. The etching process is selective to the horizontal surfaces and etches material from the horizontal surfaces at a much greater rate than it etches material from vertical surfaces. Therefore, after the etching process, only vertical spacers 31 remain on the sides of the opening 30. Further, the etching process is selected to not etch or damage the insulator areas 22 or the dielectric 27, which is not yet grown.

As is well known in the art, a sacrificial oxide (not shown) is grown and gate-channel 20 tailor implants are performed. The sacrificial oxide is stripped and a center gate oxide 27 is grown.

As shown in FIG. 3B, a P+ type or N+ type polysilicon 25 (or other well known conductor) is deposited in the opening 30 and planarized using, for example, chemical mechanical polishing (CMP). The nitride spacers 31 are etched selectively to adjacent oxide 22 and polysilicon 25. This process forms openings 33 between the center gate conductor 25 and the pad material 22.

The outer dielectric 28 is grown in the openings 33, as shown in FIG. 3C. This process also forms dielectric 29 on the sidewall of the center gate conductor 25. More specifically, the substrate (e.g., silicon) material 20 and the gate conductor (e.g., polysilicon) material 25 are oxidized using, for example, dry or wet silicon/polysilicon oxidation conditions which are well know in the art. This forms a dielectric (e.g., oxide) 28, 29 layer only along the substrate 20 and gate conductor 25 surfaces, leaving the pad material 22 unchanged and leaving a space for the outer gate conductors 26 in the openings 33. Further, the dielectric material 28, 29 has a thickness which is easily controlled by the temperature, time and ambient gas conditions, as is well known in the art. Therefore, the thickness of the center gate dielectric 27 may be determined independently of the thickness of the outer gate conductor dielectric 28.

The outer gate conductors 26 are then deposited in the openings 33. The material (and/or polarity) for the outer gate conductors 26 and central gate conductor 25 may be the same or different depending upon the specific application involved. For an NMOSFET, the side-wing gate conductors 26 are preferably made of N+ polysilicon and the central gate conductor 25 are preferably a P+ polysilicon if a high Vt NMOSFET is desired (as in a DRAM application), or N+ polysilicon if a low Vt NMOSFET is needed for enhanced performance. Similarly, for a PMOSFET, the side-wing gate conductors 26 are preferably made of P+ polysilicon and the central gate conductor 25 are preferably a N+ polysilicon if a high Vt PMOSFET is desired (as in a DRAM application), or P+ polysilicon if a low Vt PMOSFET is needed for enhanced performance.

Any remaining oxide over the gate conductors 25, 26 is stripped, which also consumes a small amount of the oxide pad 22, and the gate conductors 25, 26 are recessed below the top of the dielectric pad 22 and a conductor 23 is formed along the top surfaces of the gate conductors 25, 26 to electrically connect the gate conductors 25, 26. For example, if the gate conductors 25, 26, are formed of a polysilicon material, a silicide material can be formed by depositing a refractory metal, such as titanium, cobalt or tungsten and processing the structure through a thermal cycle. As mentioned above, the silicide layer 23 provides a low resistance strap between gate conductor regions 25, 26.

The gate cap 24 is then formed using, for example, a layer of nitride or oxide deposited in a chemical vapor deposition process. The gate cap 24 is then planarized to be even with the top of the pad material 22. The pad material 22 is then etched in a selective etch process which allows the gate cap 24 to remain on the gate stack structure. The gate cap 24 over the gate conductors 25, 26 is used for subsequent formation of source/drain diffusion regions 21 and associated contacts (not shown) which are, for example, borderless to the gate conductor 25, 26. Conventional processing follows which includes gate sidewall oxidation, source/drain extension implants, and formation of sidewall spacers, contacts, interlevel dielectrics and wiring levels using processes well known to those ordinarily skilled in the art to form the completed structure shown in FIG. 2.

Figure 4A:
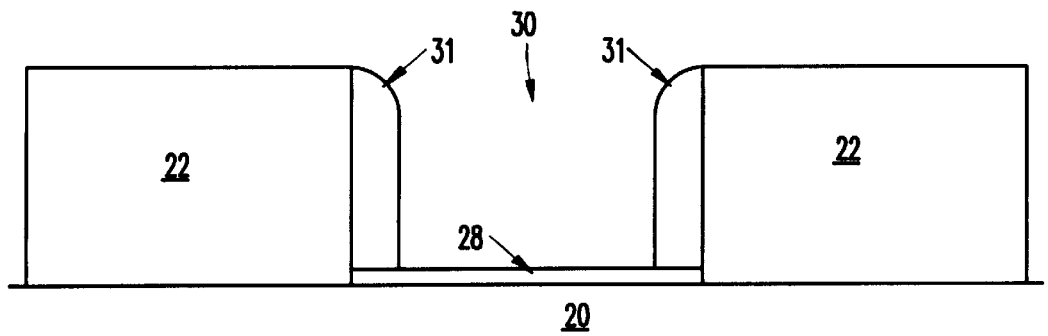
FIG. 4A–4C are schematic diagrams of a cross-sectional view of a partially completed integrated circuit according to the invention.
Figure 4B:
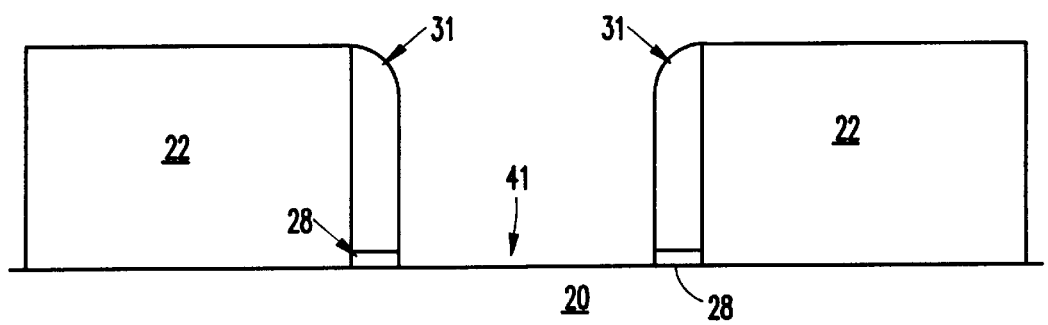
Figure 4C:
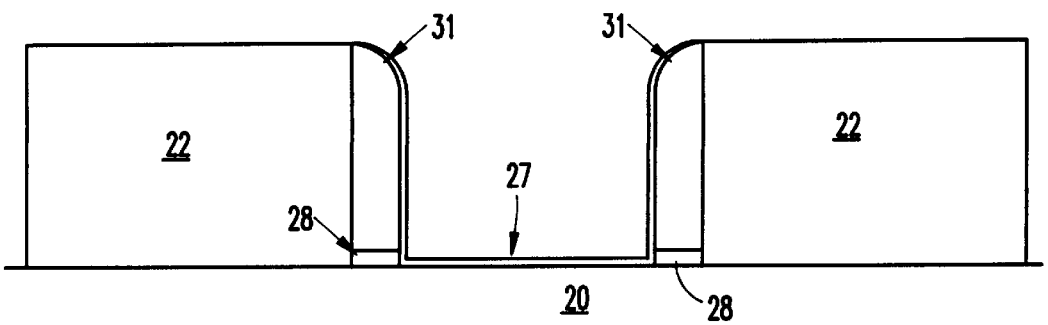

An alternative embodiment of the invention is shown in FIGS. 4A–4C. The processing in FIGS. 4A–4C is similar to the processing in FIGS. 3A–3C. However, the outer gate oxide dielectric 28 is formed before the central gate oxide dielectric 27.

More specifically, as shown in FIG. 4A, the opening 30 in the pad material 22 is formed as discussed above. However, the dielectric 28 is formed (using the same process as described above) before the sacrificial sidewall spacers 31 are formed. Then, as shown in FIG. 4B, the dielectric 28 not protected by the sidewall spacers 31 is removed using, for example, a reactive ion etching process, as shown in area 41. Subsequently, as shown in FIG. 4C, the central gate conductor dielectric 27 is formed, preferably by thermal oxidation, nitridation or a combination thereof.

As with the previous embodiment, the thickness of the dielectric layers 27, 28 are independent and are formed in different processing steps. However, in the second embodiment, the thickness of the outer gate conductor dielectric 28 is determined by the formation process of the dielectric 28 shown in FIG. 4A, while the thickness of the center gate conductor dielectric 27 is determined by the formation process shown in FIG. 4C. The remaining processing for the second embodiment is the similar to the first embodiment except for the foregoing changes.

Figure 5:
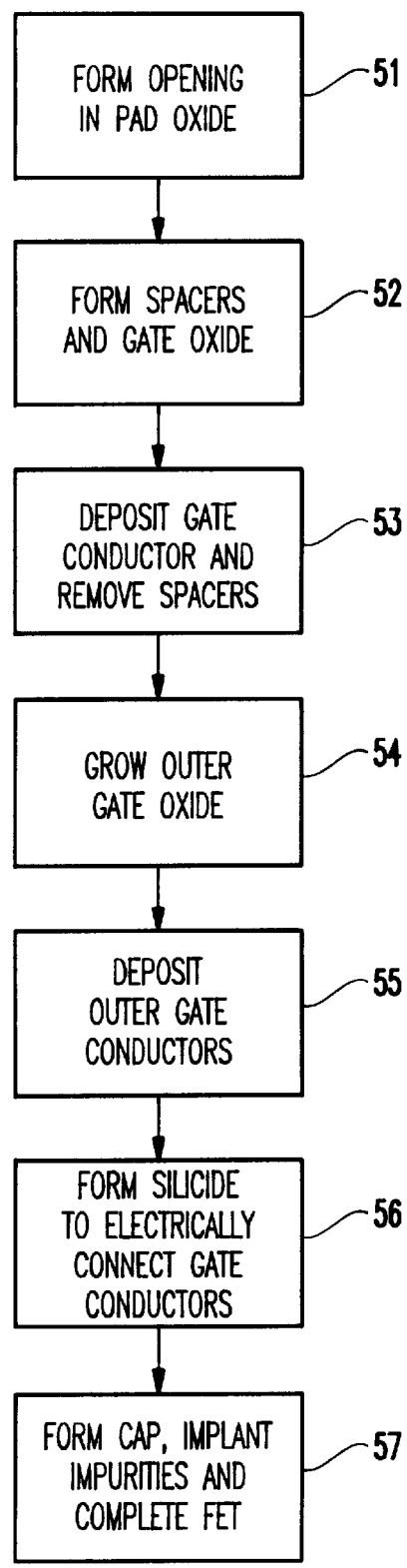
FIG. 5 is a flow diagram illustrating a preferred method of the invention.

A flowchart of an embodiment of the invention is shown in FIG. 5. More specifically, in item 51, the dielectric stack 22 is formed over the substrate 20. In item 52, the spacers 31 and central gate conductor oxide 27 are formed in the opening 30.

The gate conductor 25 is then formed in the opening 30 and the spacers are removed to create openings 33 in item 53. In item 54, the outer gate oxide 28 is grown in the openings 33. In item 55, the outer gate conductors 26 are deposited and in item 56 the silicide 23 is formed to electrically connect the outer and center gate conductors 25, 26. Finally, the cap 24, source and drain regions 21 and remaining structures are formed to complete the field effect transistor as shown in item 57.

Thus, as described above, the invention includes a central gate conductor 25 whose edges may slightly overlap the source/drain diffusion regions 21, and "side-wing" outer edge gate conductors 26 which are separated from the central gate conductor by a thin insulating layer 29. The gate insulator thicknesses under the central gate conductor 27 and under the side-wing conductors 28 are independently specifiable. This allows the gate insulator under the side conductors to be preferably thicker than under the central conductor which reduces gate induced drain leakage, which is valuable for low power applications, including low-power DRAM.

Further, the invention allows the source-drain doping type and polarity, to be independent of doping types of the central and side gate conductors. Thus, P+ gated NMOSFETs may be used with N+ gated side conductors, for example.

While the invention has been described in terms of preferred embodiments, those skilled in the art will recognize that the invention can be practiced with modification within the spirit and scope of the appended claims.

For example, while NMOSFETs and PMOSFETs are shown in the foregoing exemplary embodiment, as would be known by one ordinarily skilled in the art given this disclosure, the invention may be applied to any form a semiconductor transistor.

What is claimed is:

1. An integrated circuit structure comprising:

a substrate having a channel region and diffusion regions adjacent said channel region;

an insulator over said substrate;

a central conductor positioned above said channel region and over said insulator;

outer conductors over said insulator and adjacent said central conductor, wherein said insulator separates said central conductor from said outer conductors; and a conductive layer above said central conductor and said outer conductors electrically connecting said central conductor and said outer conductors, wherein said insulator has a first thickness under said central conductor and a second thickness greater than said first thickness under said outer conductors, and wherein said central conductor comprises a first material and said outer conductors comprise a second material different than said first material.

2. The integrated circuit in claim 1, wherein said outer conductors are above a portion of said diffusion regions.

3. A metal oxide semiconductor field effect transistor structure comprising:

a substrate having a channel region and source and drain regions adjacent said channel region;

a gate insulator over said substrate;

a central gate conductor positioned above said channel region and over said gate insulator;

outer gate conductors over said gate insulator and adjacent said central gate conductor; and a silicide layer above said central gate conductor and said outer gate conductors electrically connecting said central gate conductor and said outer gate conductors, wherein said gate insulator has a first thickness under said central gate conductor and a second thickness greater than said first thickness under said outer gate conductors, and wherein said central conductor comprises a first material and said outer conductors comprise a second material different than said first material.

4. The metal oxide semiconductor field effect transistor in claim 3, wherein said gate insulator separates said central gate conductor from said outer gate conductors.

5. The metal oxide semiconductor field effect transistor in claim 3, wherein said outer gate conductors are above a portion of said source and drain regions.

6. A metal oxide semiconductor field effect transistor structure comprising:

a substrate having a channel region and source and drain regions adjacent said channel region;

a gate insulator over said substrate;

a central gate conductor positioned above said channel region and over said gate insulator; and outer gate conductors over said gate insulator and adjacent said central gate conductor, wherein said gate insulator has a first thickness under said central gate conductor and a second thickness greater than said first thickness under said outer gate conductors, wherein said central conductor comprises a first material and said outer conductors comprise a second material different than said first material, and wherein said first material comprises a first type of polysilicon and said second material comprises a second type of polysilicon.

7. An integrated circuit structure formed by a process comprising:

forming a substrate to have a channel region and diffusion regions adjacent said channel region;

forming an insulator layer over said substrate;

forming a central conductor above said channel region and over said insulator;

forming outer conductors over said insulator and adjacent said central conductor, wherein said insulator separates said central conductor from said outer conductors; and forming a conductive layer above said central conductor and said outer conductors to electrically connect said central conductor and said outer conductors, wherein said forming of said insulator forms said insulator to have a first thickness under said central conductor and a second thickness greater than said first thickness under said outer conductors, and wherein said forming of said central conductor comprises forming a first material and said forming of said outer conductors comprises forming a second material different than said first material.

8. The integrated circuit structure in claim 7, wherein said forming of said outer conductors positions said outer conductors above a portion of said diffusion regions.

9. The integrated circuit structure in claim 7, wherein said forming of said insulator comprises:

forming a central conductor insulator to have a first thickness, before forming said central conductor; and forming outer conductor insulators to have a second thickness, after forming said central conductor.

10. An integrated circuit structure comprising:

a substrate having a channel region and diffusion regions adjacent said channel region;

an insulator over said substrate;

a central conductor positioned above said channel region and over said insulator; and outer conductors over said insulator and adjacent said central conductor;

wherein said insulator has a first thickness under said central conductor and a second thickness greater than said first thickness under said outer conductors, wherein said central conductor comprises a first material and said outer conductors comprise a second material different than said first material, and wherein said first material comprises a first type of polysilicon and said second material comprises a second type of polysilicon.

11. An integrated circuit structure comprising:

a substrate having a channel region and diffusion regions adjacent said channel region;

an insulator over said substrate;

a central conductor positioned above said channel region and over said insulator; and outer conductors over said insulator and adjacent said central conductor;

wherein said insulator has a first thickness under said central conductor and a second thickness greater than said first thickness under said outer conductors, wherein said central conductor comprises a first material and said outer conductors comprise a second material different than said first material, and wherein said first material comprises a P-type polysilicon and said second material comprises an N-type polysilicon.

12. An integrated circuit structure comprising:

a substrate having a channel region and diffusion regions adjacent said channel region;

an insulator over said substrate;

a central conductor positioned above said channel region and over said insulator; and outer conductors over said insulator and adjacent said central conductor;

wherein said insulator has a first thickness under said central conductor and a second thickness greater than said first thickness under said outer conductors, wherein said central conductor comprises a first material and said outer conductors comprise a second material different than said first material, and wherein said first material has a first polarity and said second material has a second polarity.

13. A metal oxide semiconductor field effect transistor structure comprising:

a substrate having a channel region and source and drain regions adjacent said channel region;

a gate insulator over said substrate;

a central gate conductor positioned above said channel region and over said gate insulator; and outer gate conductors over said gate insulator and adjacent said central gate conductor, wherein said gate insulator has a first thickness under said central gate conductor and a second thickness greater than said first thickness under said outer gate conductors, wherein said central conductor comprises a first material and said outer conductors comprise a second material different than said first material, and wherein said first material comprises a P-type polysilicon and said second material comprises an N-type polysilicon.

14. A metal oxide semiconductor field effect transistor structure comprising:

a substrate having a channel region and source and drain regions adjacent said channel region;

a gate insulator over said substrate;

a central gate conductor positioned above said channel region and over said gate insulator; and outer gate conductors over said gate insulator and adjacent said central gate conductor, wherein said gate insulator has a first thickness under said central gate conductor and a second thickness greater than said first thickness under said outer gate conductors, wherein said central conductor comprises a first material and said outer conductors comprise a second material different than said first material, and wherein said first material has a first polarity and said second material has a second polarity.

15. An integrated circuit structure formed by a process comprising:

forming a substrate to have a channel region and diffusion regions adjacent said channel region;

forming an insulator layer over said substrate;

forming a central conductor above said channel region and over said insulator; and forming outer conductors over said insulator and adjacent said central conductor, wherein said forming of said insulator forms said insulator to have a first thickness under said central conductor and a second thickness greater than said first thickness under said outer conductors, wherein said forming of said central conductor comprises forming a first material and said forming of said outer conductors comprises forming a second material different than said first material, and wherein said first material comprises a first type of polysilicon and said second material comprises a second type of polysilicon.

16. An integrated circuit structure formed by a process comprising:

forming a substrate to have a channel region and diffusion regions adjacent said channel region;

forming an insulator layer over said substrate;

forming a central conductor above said channel region and over said insulator; and forming outer conductors over said insulator and adjacent said central conductor, wherein said forming of said insulator forms said insulator to have a first thickness under said central conductor and a second thickness greater than said first thickness under said outer conductors, wherein said forming of said central conductor comprises forming a first material and said forming of said outer conductors comprises forming a second material different than said first material, and wherein said first material comprises a P-type polysilicon and said second material comprises an N-type polysilicon.

17. An integrated circuit structure formed by a process comprising:

forming a substrate to have a channel region and diffusion regions adjacent said channel region;

forming an insulator layer over said substrate;

forming a central conductor above said channel region and over said insulator; and forming outer conductors over said insulator and adjacent said central conductor, wherein said forming of said insulator forms said insulator to have a first thickness under said central conductor and a second thickness greater than said first thickness under said outer conductors, wherein said forming of said central conductor comprises forming a first material and said forming of said outer conductors comprises forming a second material different than said first material, and wherein said first material has a first polarity and said second material has a second polarity.

* * * * *